(12) United States Patent
Hsu

(10) Patent No.: US 11,112,699 B2
(45) Date of Patent: Sep. 7, 2021

(54) SUBSTRATE HAVING FILM TYPE PATTERN AND THE MANUFACTURING METHOD FOR MAKING THE SAME

(71) Applicant: Ming-An Hsu, Miaoli County (TW)

(72) Inventor: Ming-An Hsu, Miaoli County (TW)

( * ) Notice: Subject to any disclaimer, the term of this patent is extended or adjusted under 35 U.S.C. 154(b) by 207 days.

(21) Appl. No.: 15/461,899

(22) Filed: Mar. 17, 2017

(65) Prior Publication Data

US 2017/0269479 A1  Sep. 21, 2017

(30) Foreign Application Priority Data

Mar. 17, 2016  (TW) ................................ 105108294
Mar. 17, 2016  (TW) ................................ 105203698

(51) Int. Cl.
| | | |
|---|---|---|
| G03F 7/16 | (2006.01) | |
| G03F 7/26 | (2006.01) | |
| G03F 7/095 | (2006.01) | |
| G03F 7/20 | (2006.01) | |
| G03F 7/40 | (2006.01) | |
| H04B 1/3888 | (2015.01) | |

(52) U.S. Cl.
CPC .............. *G03F 7/40* (2013.01); *G03F 7/2014* (2013.01); *H04B 1/3888* (2013.01)

(58) Field of Classification Search
CPC .......... G03F 7/40; G03F 7/405; G03F 4/2014; G03F 7/2016; G03F 7/2018; G03F 7/202; H04B 1/3888; B32B 7/06; B32B 7/12; B32B 25/02; B32B 25/08; B32B 25/16; B32B 27/08; B32B 27/16; B32B 27/20; B32B 27/205; B32B 27/28; B32B 27/306; B32B 27/32; B32B 27/36; H01L 29/4236; H01L 29/7813; H01L 21/0334; H01L 21/76216; H01L 21/76221; H01L 21/266; H01L 21/32; H01L 29/0657; H01L 29/0847; Y10S 438/978; Y10S 438/974; Y10S 438/975; Y10S 438/942; Y10S 438/948; Y10S 438/949; Y10S 438/95; Y10S 438/438; Y10S 438/951; Y10S 438/952; Y10S 438/947; Y10S 438/946; Y10S 468/945; Y10S 438/944; Y10S 438/943
USPC .................................................. 430/311–330
See application file for complete search history.

(56) References Cited

U.S. PATENT DOCUMENTS

| | | | | |
|---|---|---|---|---|
| 4,261,761 A | * | 4/1981 | Sato ................... | H01L 29/66659 438/270 |
| 2002/0132189 A1 | * | 9/2002 | Huang ................... | G03F 7/0035 430/312 |
| 2015/0153649 A1 | * | 6/2015 | Lee .......................... | G03F 7/40 216/47 |

* cited by examiner

*Primary Examiner* — Maria V Ewald
*Assistant Examiner* — Ethan Weydemeyer
(74) *Attorney, Agent, or Firm* — Muncy, Geissler, Olds & Lowe, P.C.

(57) ABSTRACT

A substrate having film type pattern and the manufacturing method, the substrate having film type pattern includes: a substrate; at least film type pattern layer which is allocated on the substrate; and a peripheral pattern layer which is allocated around the film type pattern layer.

12 Claims, 17 Drawing Sheets

SUBSTRATE HAVING FILM TYPE PATTERN AND THE MANUFACTURING METHOD FOR MAKING THE SAME

TECHNICAL FIELD

The present invention relates to a substrate, in particular, relates to a substrate having film type pattern and the manufacturing method for making the same.

BACKGROUND

Currently, intelligent device such as intelligent cell phone, watch and medical equipment, equipped with large screen for user watching the information thereon. Besides having strong functions, gradually the design styles of the devices having large screens have been personalized and beautiful, including appearance, shape and color. Etc. Those design styles must be realized by the inspired shell design and fabrication. From now on, the dimensional shell designs are especially attractive and gradually becoming the future trend of intelligent devices.

Patterns, wires, protection film and so on can be formed on a dimensional shell. The technology regarding directly forming patterns, wires, protection film and so on includes methods as follows: the first forming method is transfer printing that forming a planar pattern and transferring it to a 3-dimensional target. The cost of transfer printing is low but the fabrication thereof is slow and the resolution of formed wires is low. The second forming method is ink jet and laser scribing that spraying dye to a 3-dimensional target, and scribing the pattern via laser scribing. The cost of the second forming method is expensive, and the fabrication thereof is slow, and the cost of equipment is also expensive but the advantage is the resolution of the formed wires is high, for example, about 20 μm.

Accordingly, the vendors of fabricating intelligent devices are expecting a developing direction that how to develop a fabrication method for forming film type pattern including advantages of low fabrication cost, fast fabrication speed, low material cost and high resolution of formed wires and being able to form pattern or protection film on a planar substrate or a 3-dimensional substrate.

SUMMARY

To achieve aforesaid objects, the present application provides a substrate having film type pattern and the manufacturing method for making the same to realize the technical effect including once photomask, etching-free or once etching and the special technical effect of seamlessly forming a film type pattern.

The present application provides a manufacturing method for making a substrate having film type pattern, including steps of: forming an underlying color layer on a substrate; forming a lift-off photoresist layer on the substrate having the underlying color layer; providing a photomask attached on the substrate; processing an exposure; removing an unexposed part of the lift-off photoresist layer to form a pattern space; removing the underlying color layer under the pattern space formed by the lift-off photoresist; forming at least a film layer on partial region having the pattern space of the substrate; and forming a film type pattern by removing the lift off photoresist layer.

The present application further provides a manufacturing method for making a substrate having film type pattern, including steps of: forming an underlying photoresist layer on a substrate; forming a lift-off photoresist layer on the substrate having the underlying photoresist layer; providing a photomask attached on the substrate; processing an exposure; once removing an unexposed part of the lift-off photoresist layer and the underlying photoresist layer to form a pattern space; forming at least a film layer on partial region having the pattern space of the substrate; and forming a film type pattern by removing the lift off photoresist layer.

The present application additionally provides a substrate having film type pattern, including: a substrate; at least a film type pattern layer formed on the substrate; and a periphery pattern layer formed on the substrate and seamlessly surrounding the film type pattern layer.

To make the aforesaid and other objects, features and advantages of the present invention can be more apparent and easier to be understood, some embodiments are introduced in following quotes, and in together with the accompanying drawings to make a detailed description below (embodiments).

DETAILED DESCRIPTION

According to the embodiments of the present application, a technical means of photoresist lift off process is used by the present application, therefore realizing the technical effect including once photomask, etching-free or once etching, and the special technical effect of seamlessly forming a film type pattern. Several embodiments below are used to describe the specific practices of the present application.

Figure 1A:
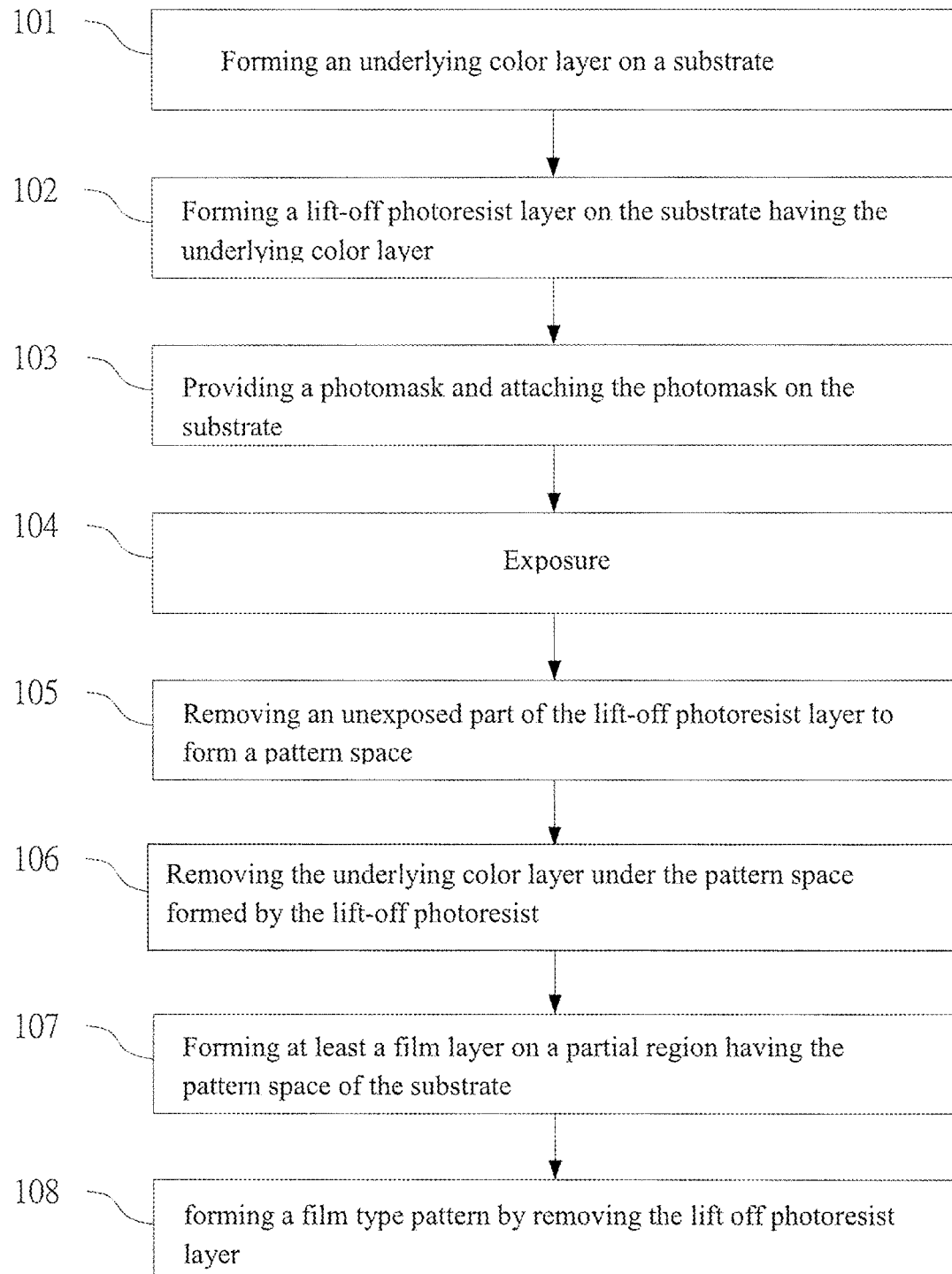
FIGS. 1A to 1D are several specific embodiments of flow charts of the manufacturing methods for making a substrate having film type pattern of the present application.

Please referring to FIG. 1A, a specific embodiment of flow charts of the manufacturing methods for making a substrate having film type pattern of the present application is disclosed, which includes steps of:

Step 101: forming an underlying color layer on the substrate. The underlying color layer can be metal film layer, inorganic metal oxide film layer, non-metal oxide film layer or non-metal film layer, and further achieving several different colors including transparent, black, white, gold or silver.

Step 102: forming a lift-off photoresist layer on the substrate having the underlying color layer, and serving the lift-off photoresist layer as a sacrifice layer.

Step 103: attaching a photomask on the substrate. The photomask includes a structure of predetermined film type pattern.

Step 104: processing an exposure.

Step 105: removing an unexposed part of the lift-off photoresist layer to form a pattern space. After the exposure process, the unexposed part of the lift-off photoresist layer can be removed by a developer, and a pattern space of the lift-off photoresist layer can be formed and the underlying color layer can be exposed by the pattern space of the lift-off photoresist layer.

Step 106: removing the underlying color layer under the pattern space formed by the lift-off photoresist. In accordance with a pattern space is formed by the lift-off photoresist layer, the underlying color layer under the lift-off photoresist layer corresponding to the pattern space can be partially exposed. By using different etching solutions depending upon the demand of the underlying color layer, a pattern space of the underlying color layer can be formed by etching. The substrate is exposed by the pattern space of the underlying color layer. Only once etching is needed for the step.

Step 107: forming at least a film layer on partial region having the pattern space of the substrate. The at least a film layer can cover on the space exposed by the pattern space and on the lift-off photoresist layer, and different color effect can be performed depending upon different layers number of the film layer. For example, simply a gold film layer or silver film layer and so on. The at least a film layer can be selected from the group in consist of: a metal film layer, an inorganic metal oxide film layer, a non-metal oxide film layer and a non-metal film layer. The way to form the film layer can include sputtering, vapor deposition or spraying.

Step 108: removing the lift-off photoresist layer to form a film type pattern. After the lift-off photoresist layer is removed, at least a film layer is left to be covered with entire of the pattern space so that the film type pattern is formed. The film type pattern can seamlessly connect the underlying color layer.

It can be figured out that in the manufacturing methods for making a substrate having film type pattern of the present application, a film-type pattern can be manufactured by simply once photomask and once etching, and a special technical effect of seamlessly connecting the film-type pattern to the underlying color layer can be achieved. Some special technical effects such as simple fabrication process, low cost and high yield can be also achieved.

Figure 1B:
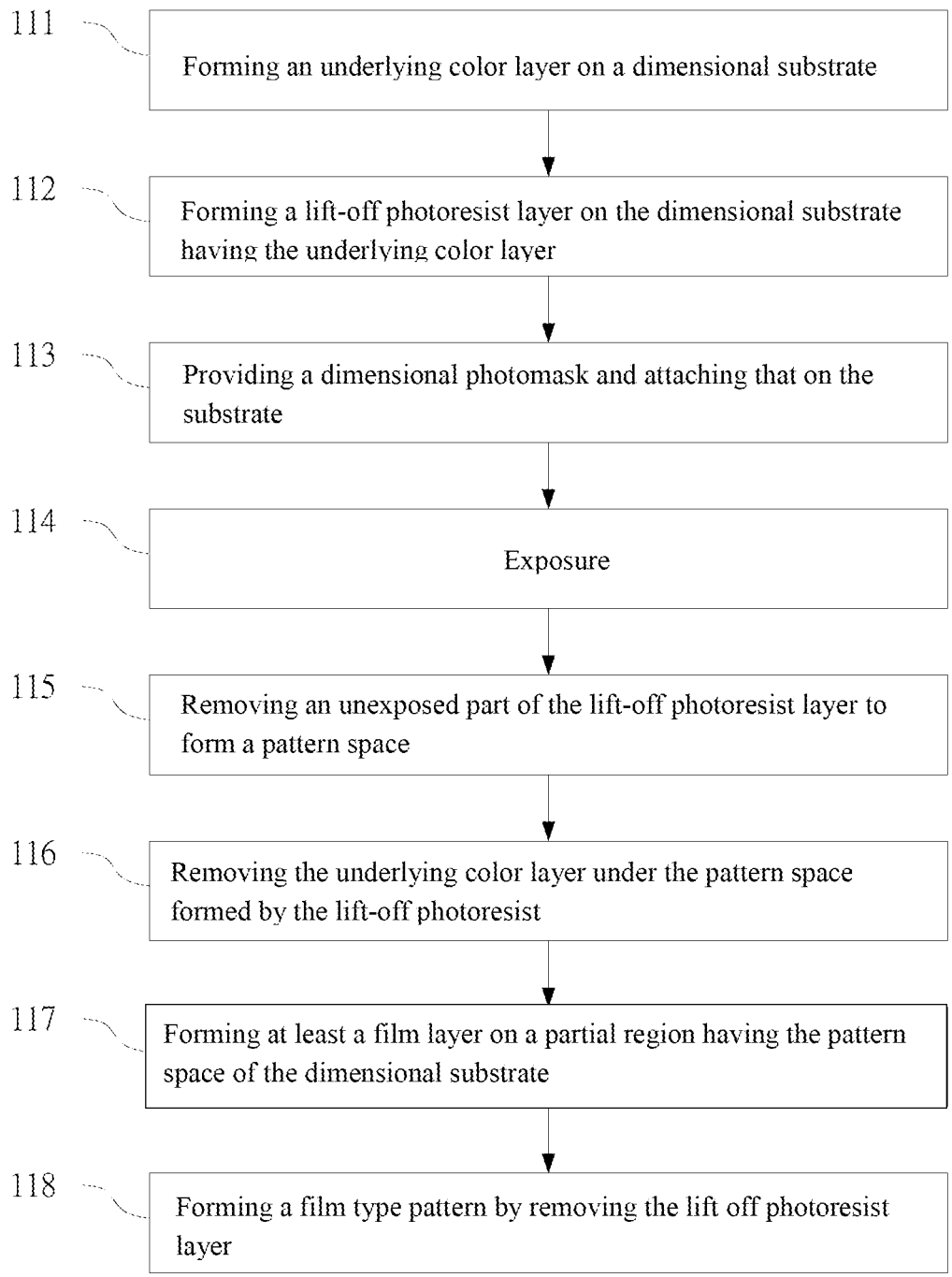

Please referring to FIG. 1B, another specific embodiment of flow charts of the manufacturing methods for making a substrate having film type pattern of the present application is disclosed, which includes steps of:

Step 111: forming an underlying color layer on a 3-dimensional substrate.

Step 112: forming a lift-off photoresist layer on the 3-dimensional substrate having the underlying color layer.

Step 113: providing a dimensional photomask and attaching the dimensional photomask on the 3-dimensional substrate.

Step 114: processing an exposure.

Step 115: removing an unexposed part of the lift-off photoresist layer to form a pattern space.

Step 116: removing the underlying color layer under the pattern space formed by the lift-off photoresist.

Step 117: forming at least a film layer on the 3-dimensional substrate having the pattern space.

After comparing FIG. 1B to FIG. 1A, it can be figured out the difference between them are merely that FIG. 1B is applied to a 3-dimensional substrate and a dimensional photomask (or film type photomask) is used in FIG. 1B, and other parts thereof are the same with that of FIG. 1A, therefore it's unnecessary to make additional description.

In the present embodiment, at least a film layer can be formed on the dimensional part of the 3-dimensional substrate, which is not able to be manufactured in current conventional art, and there are many defects in conventional art. In other words, a special technical effect that the film type pattern formed on the dimensional part of a 3-dimensional substrate can be further achieved by using the manufacturing methods for making a substrate having film type pattern of the present application.

Figure 1C:
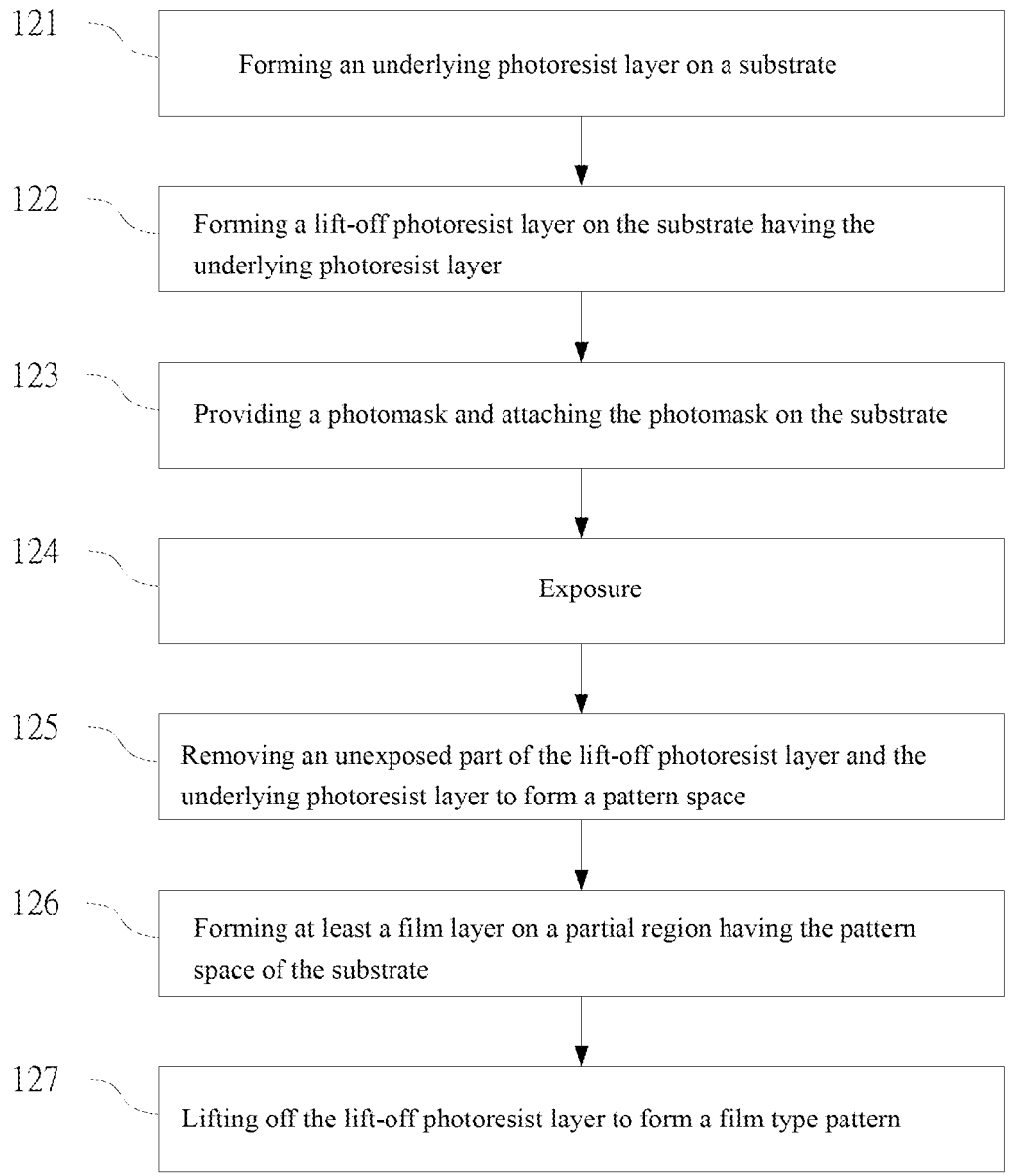

Please referring to FIG. 1C, another specific embodiment of flow charts of the manufacturing methods for making a substrate having film type pattern of the present application is disclosed, which includes steps of:

Step 121: forming an underlying photoresist layer on the substrate. Similar to the underlying color layer of FIG. 1A, the underlying photoresist layer is configured to be a permanent layer, and further achieving several different colors including transparent, black, white, gold or silver.

Step 122: forming a lift-off photoresist layer on the substrate having the underlying photoresist layer, and serving the lift-off photoresist layer as a sacrifice layer.

Step 123: attaching a photomask on the substrate. The photomask includes a structure of needed film type pattern.

Step 124: processing an exposure.

Step 125: removing the unexposed parts of the lift-off photoresist layer and the underlying photoresist layer to form a pattern space. The unexposed parts of the lift-off photoresist layer and the underlying photoresist layer can be removed by a developer, and the pattern space on the lift-off photoresist layer and the underlying photoresist layer. The substrate can be exposed by the pattern space of the lift-off photoresist layer and the underlying photoresist layer.

Step 126: forming at least a film layer on the substrate having the pattern space. The at least a film layer can cover on the space exposed by the pattern space and on the lift-off photoresist layer, and different color effect can be performed depending upon different layer numbers of the film layer. For example, simply a gold film layer or silver film layer and so on. The at least a film layer can be elected from any combination below in consist of: a metal film layer, an inorganic metal oxide film layer, a non-metal oxide film layer and a non-metal film layer.

Step 127: Lifting off the lift-off photoresist layer to form a film type pattern. When the lift-off photoresist layer is removed, only the at least a film layer is left to be covered with entire of the pattern space to form the film type pattern. The film type pattern can seamlessly connect the underlying photoresist layer.

It can be figured out that in the manufacturing method of the film type pattern of FIG. 1C of the present application, by using lift-off process and once processing exposure and development to two photoresist layers, a film-type pattern can be manufactured by simply once photomask without etching, and a special technical effect of seamlessly connecting the film type pattern to the underlying color layer can be achieved. Some special technical effects such as simple fabrication process, low cost and high yield can be also achieved.

Figure 1D:
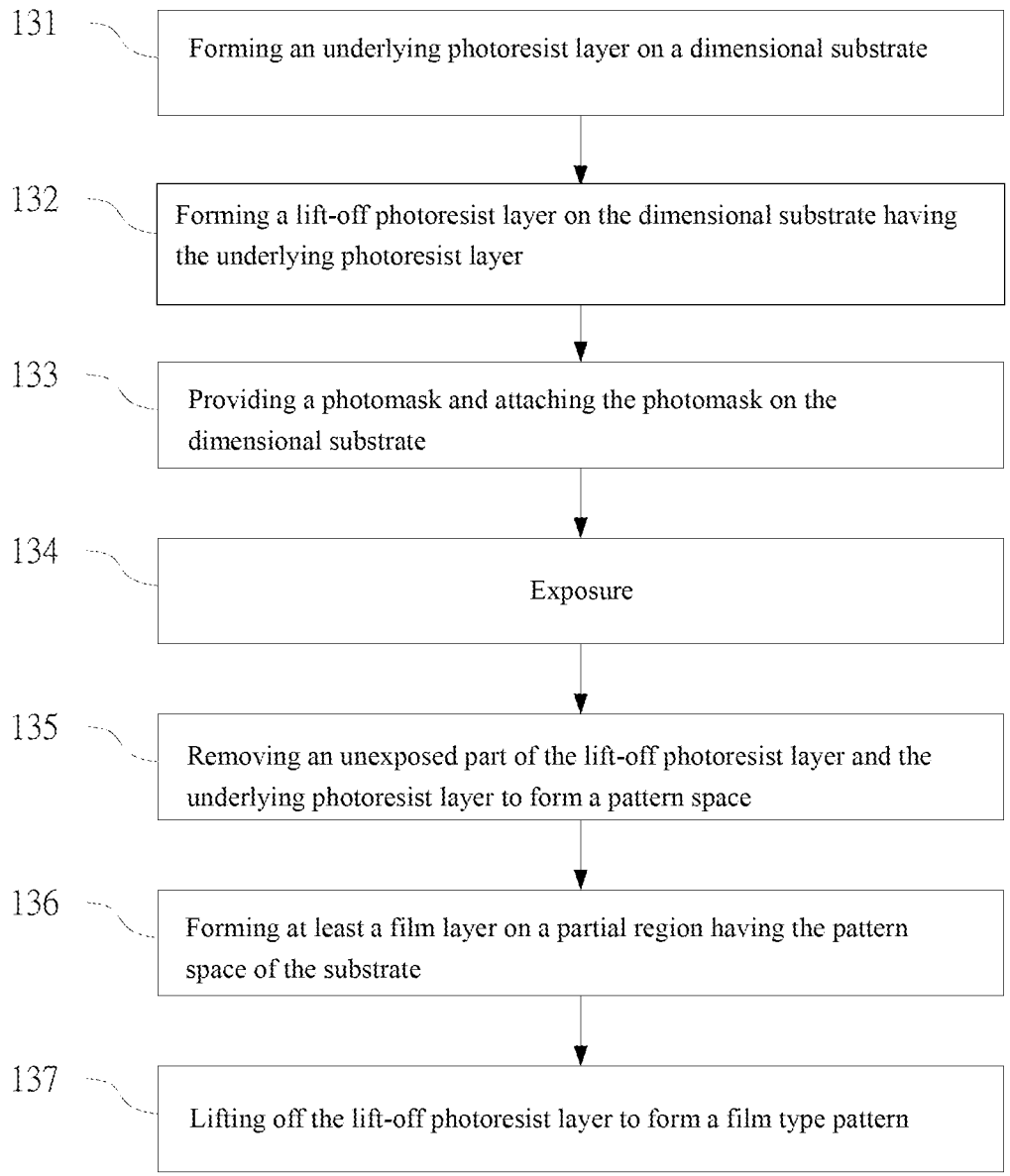

Please referring to FIG. 1D, another specific embodiment of flow charts of the manufacturing methods for making a substrate having film type pattern of the present application is disclosed, which includes steps of:

Step 131: forming an underlying photoresist layer on a 3-dimensional substrate.

Step 132: forming a lift-off photoresist layer on the 3-dimensional substrate having the underlying photoresist layer.

Step 133: providing a dimensional photomask and attaching the dimensional photomask on the 3-dimensional substrate.

Step 134: processing an exposure.

Step 135: removing an unexposed parts of the lift-off photoresist layer and the underlying photoresist layer to form a pattern space.

Step 136: removing the underlying photoresist layer under the pattern space formed by the lift-off photoresist.

Step 137: lifting-off the lift-off photoresist layer and the underlying photoresist layer to form a film type pattern.

After comparing FIG. 1D to FIG. 1C, it can be figured out the difference between them are merely that FIG. 1D is applied to a 3-dimensional substrate and a dimensional photomask (or film photomask) is used in FIG. 1D, and other parts thereof are the same with that of FIG. 1C, therefore it's unnecessary to make additional description.

In the present embodiment, at least a film layer can be formed on the dimensional part of the 3-dimensional substrate, which is not able to be manufactured in current conventional art, and there are many defects in conventional art. In other words, a special technical effect that the film type pattern formed on the dimensional part of a 3-dimensional substrate can be further achieved by using the manufacturing methods for manufacturing a substrate having film type pattern of the present application.

Figure 2A:
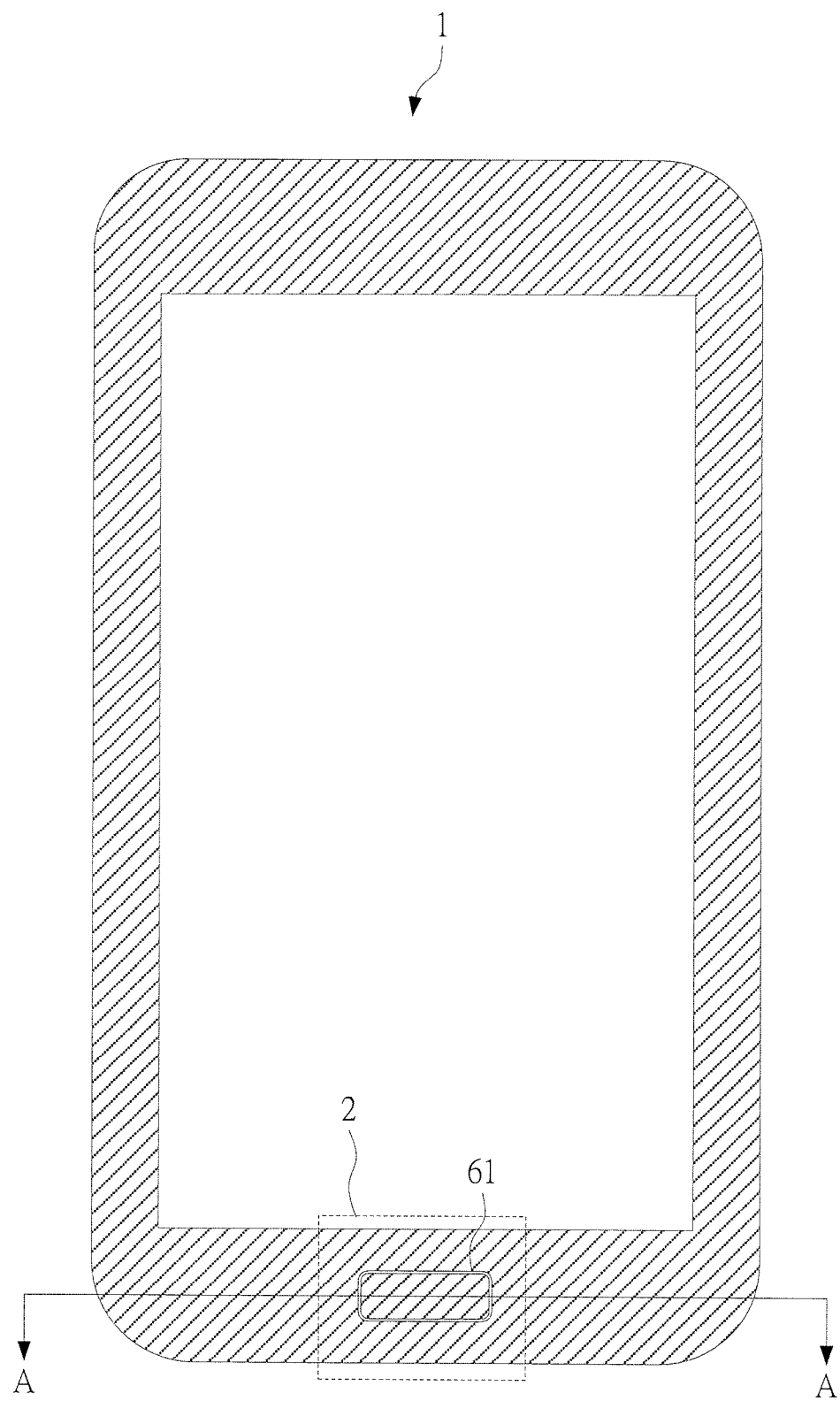
FIGS. 2A and 2B are a magnified front cross-sectional schematic diagram and a magnified partially cross-sectional schematic diagram, respectively, of a specific embodiment applying the substrate having film type pattern of the present application.
Figure 2B:
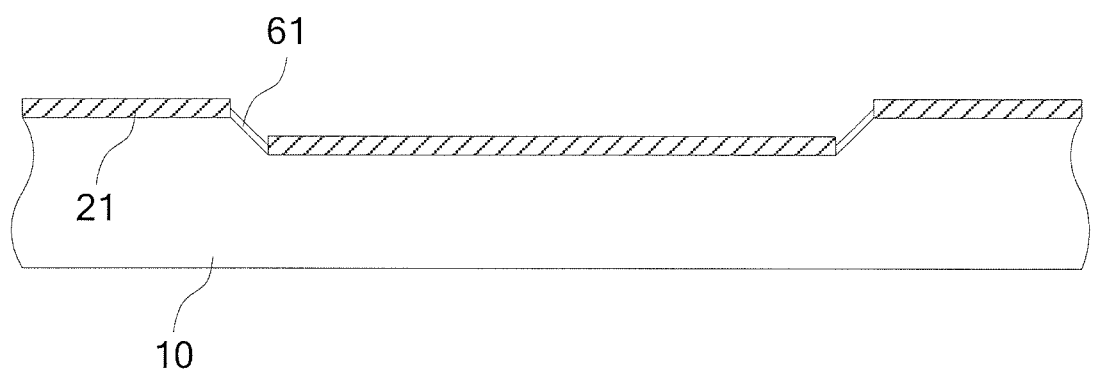

Please referring to FIGS. 2A and 2B, a magnified front cross-sectional schematic diagram and a magnified partially cross-sectional schematic diagram, respectively, of a specific embodiment applying the substrate 1 having film type pattern of the present application are illustrated, wherein FIG. 2B is the schematic diagram of part 2 of a cross section along line A-A in FIG. 2A. The substrate 1 having a film type pattern includes: a 3-dimensional substrate 10, at least a film type pattern 61 and an underlying photoresist layer 21 (periphery pattern layer), wherein the film type pattern 61 is formed on the 3-dimensional substrate and the periphery pattern layer 21 is formed on the 3-dimensional substrate 10 and seamlessly surrounding the film type pattern 61. Therefore, the pattern of FIG. 2A can be clearly performed. From FIG. 2B, it can be identified that the film type pattern 61 is formed on the dimensional part of the 3-dimensional substrate 10 and seamlessly surrounded by the periphery pattern layer 21. To perform the dimensional pattern effect as FIGS. 2A and 2B, the manufacturing method of FIG. 1B can be used. AS following, the manufacturing method for making a substrate having film type pattern is clearly described by the flow of FIG. 1B incorporating with the flow chart of FIGS. 3A to 3F.

Figure 3A:
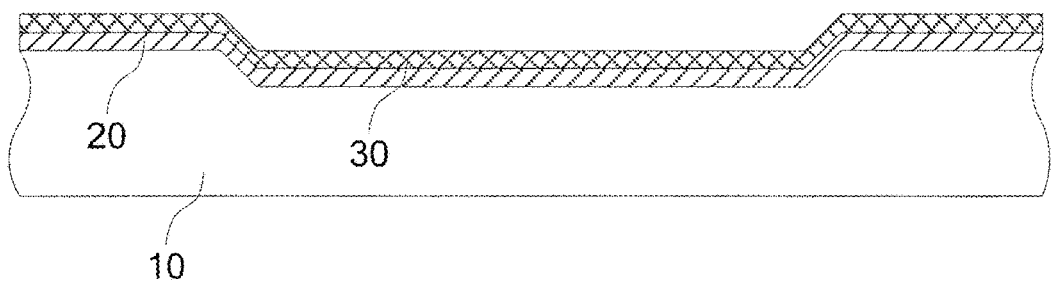
FIGS. 3A to 3F are the schematic diagrams of the manufacturing flow of FIG. 1D of the present application.

In the embodiment of FIG. 1D, the underlying photoresist layer 20 and the lift-off photoresist layer 30 formed on the 3-dimensional substrate 10 in sequence can be described in accordance with steps 131,132 illustrated by FIG. 3A.

Figure 3B:
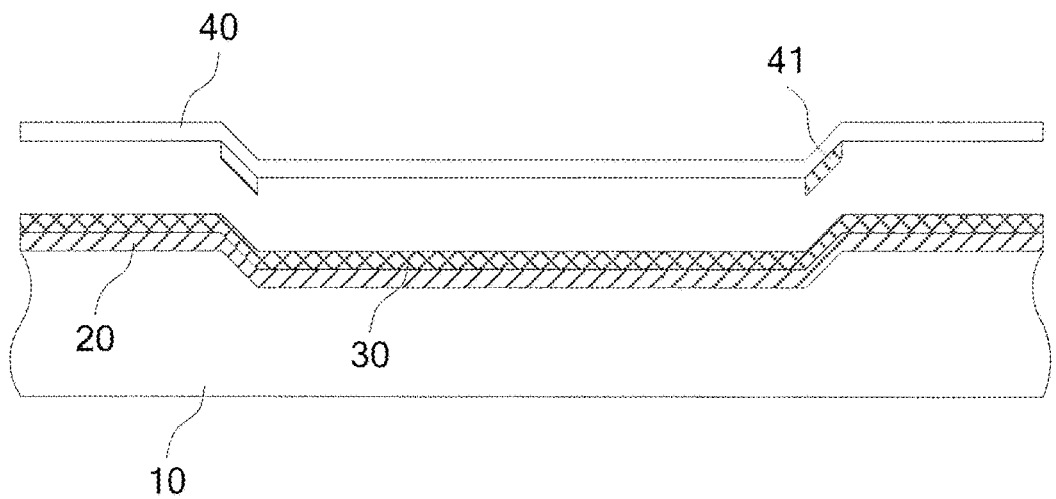

FIG. 3B illustrates step 133 attaching a dimensional photomask 40 on the 3-dimensional substrate 10, wherein the dimensional photomask is arranged with pattern structure 41, Therefore, the so called dimensional photomask 40 can be achieved by using film type photomask and attaching aids.

Figure 3C:
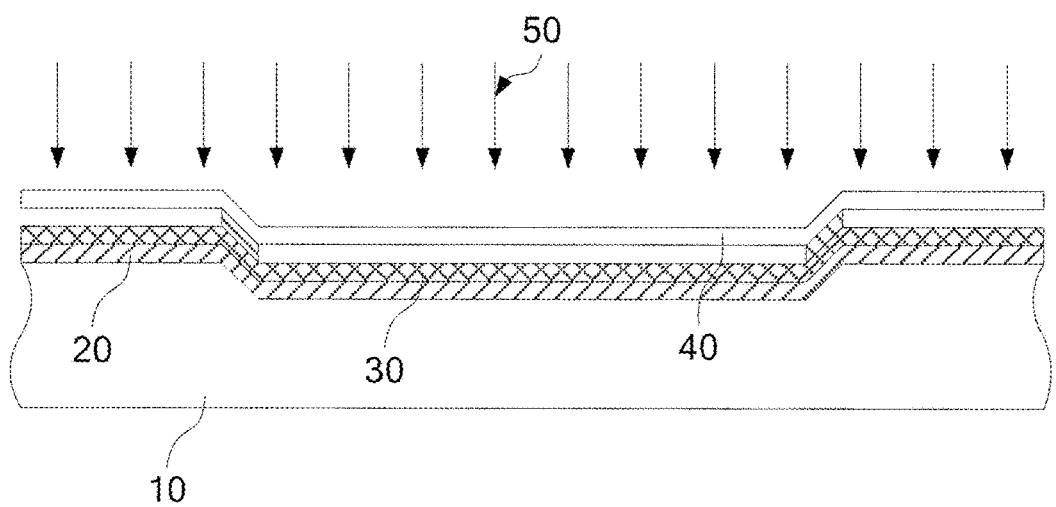

FIG. 3C illustrates the exposure of step 134 is processed by a ultra-violet light 50.

Figure 3D:
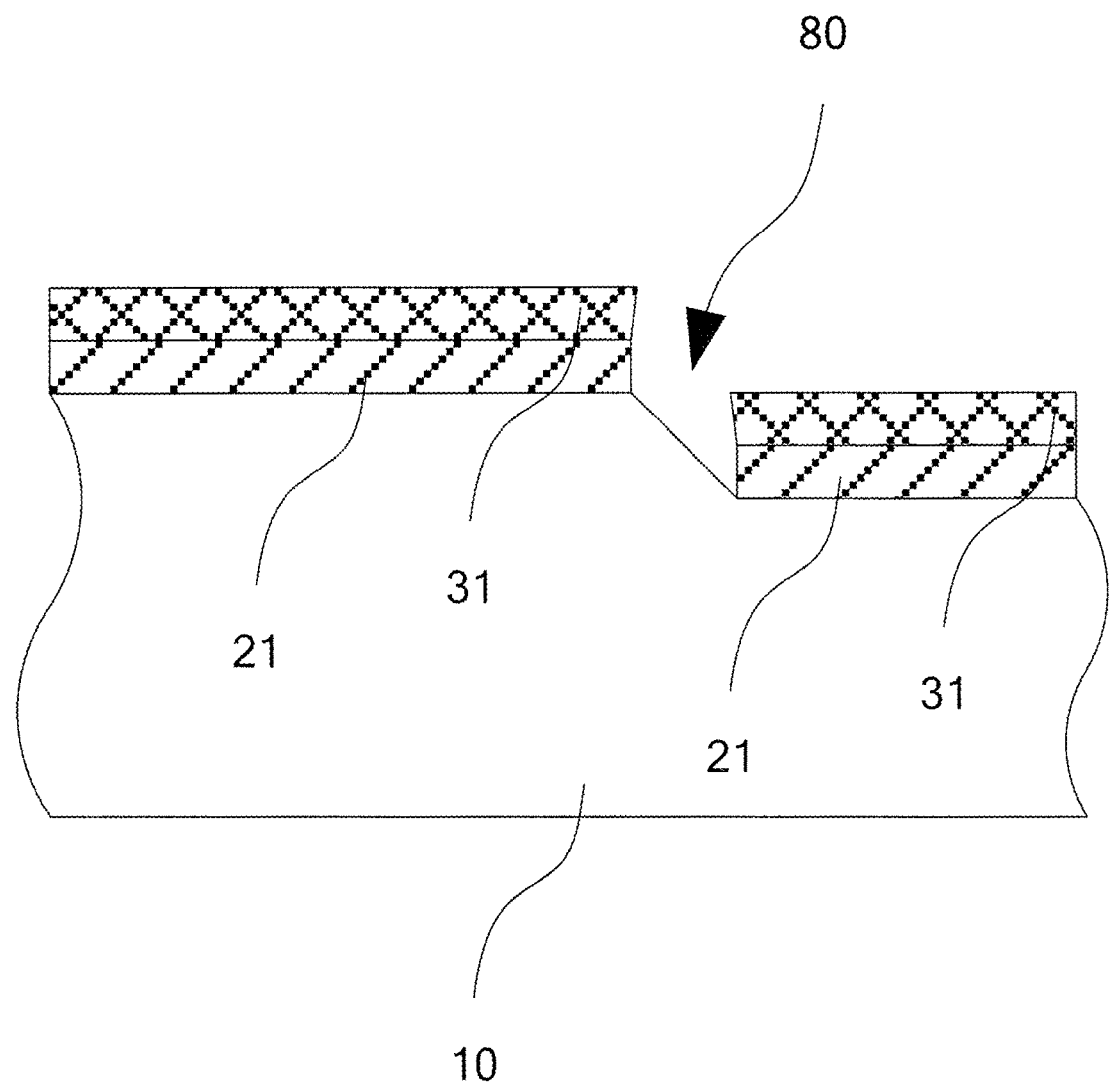

FIG. 3D is the partially magnified diagram of FIG. 3C to clearly implementing step 135: after removing the unexposed part of the lift-off photoresist layer 30 and the underlying photoresist layer 20 to form a pattern space 80, lifting off the structure of the lift-off photoresist layer 31. It can be figured out that the lift-off photoresist layer 31 is in a shape of inverted trapezoidal distinguished from the underlying photoresist layer 21. In accordance with the special structure of the lift-off photoresist layer 31, the film layer subsequently formed thereon can be easily removed.

Figure 3E:
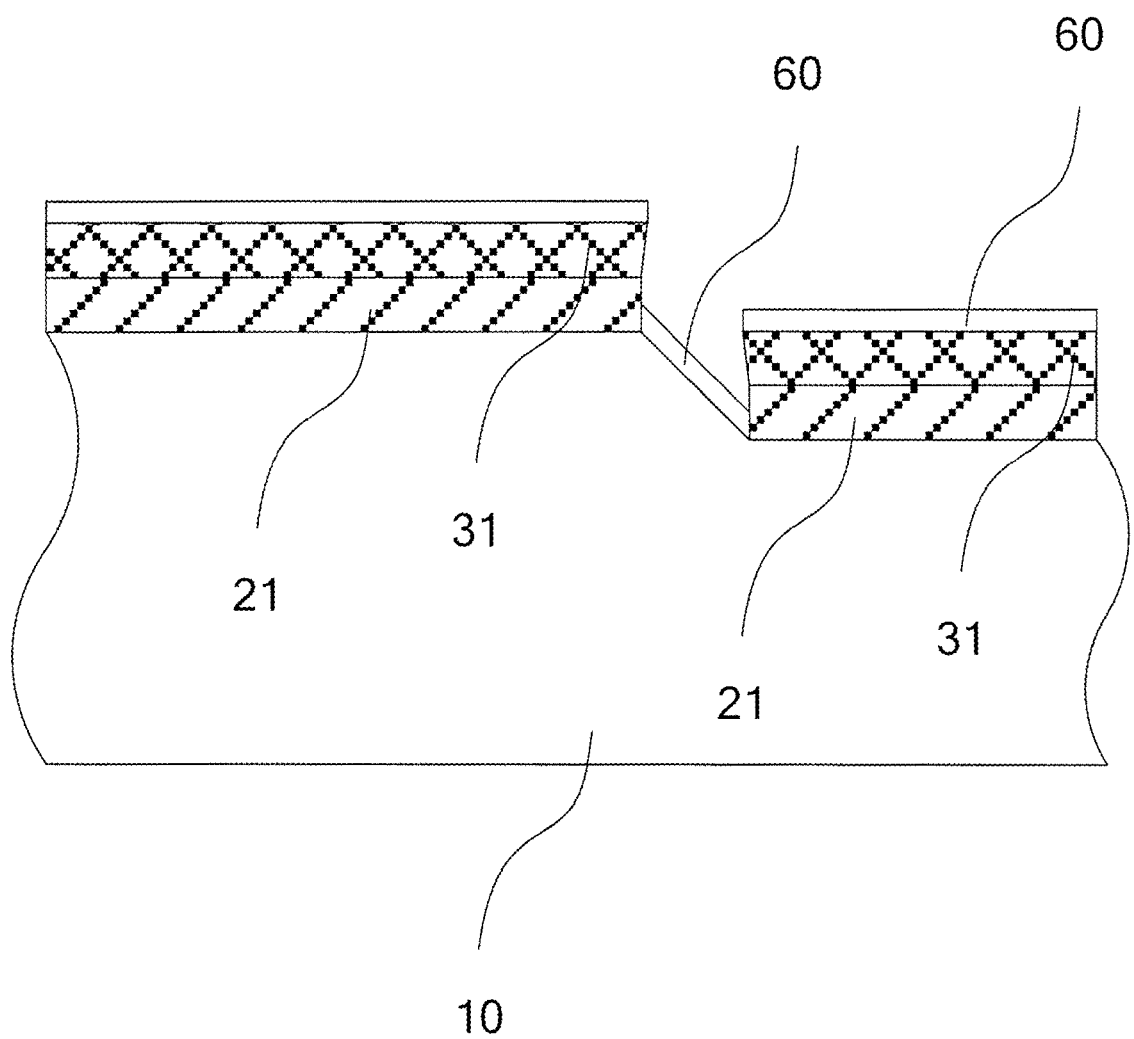

FIG. 3E illustrates step 136: a condition of forming at least a film layer 60 on the 3-dimensional substrate having the pattern space. It can be figured out that the original pattern space 80 is covered with film layer 60, and the film layer 60 is also formed on a part not removed by the developer of the lift-off photoresist layer 31. The film layer 60 formed on the lift-off photoresist layer 31 can be removed in together with that formed on the pattern space 80.

Figure 3F:
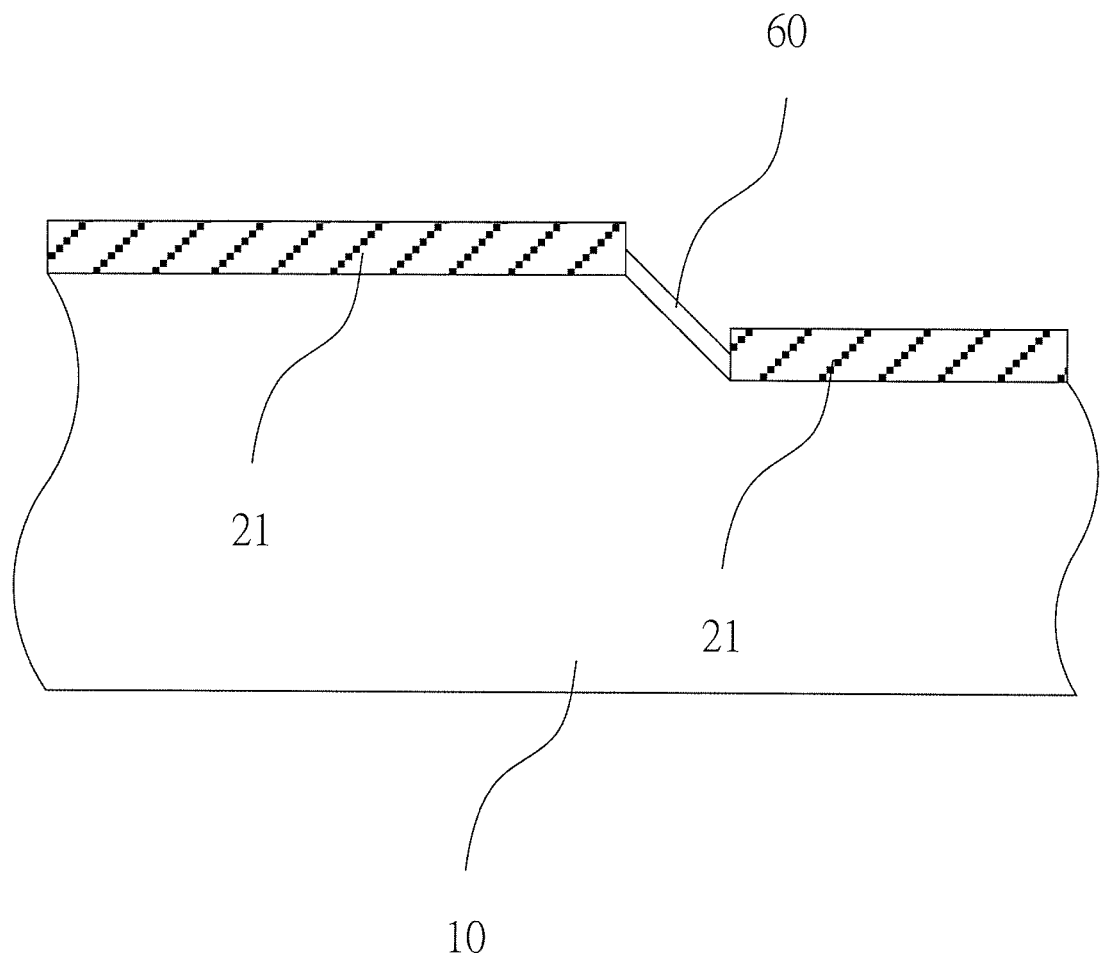

FIG. 3F illustrates step 137: a condition of after lifting off the lift-off photoresist layer 31 to form a film type pattern. In FIG. 3F it can be clearly identified that only the film layer 60 is left on the dimensional portion of the 3-dimensional substrate 10, and other portion is covered with the underlying photoresist layer 21. Accordingly, the pattern structure of FIG. 2B can be formed.

Figure 4A:
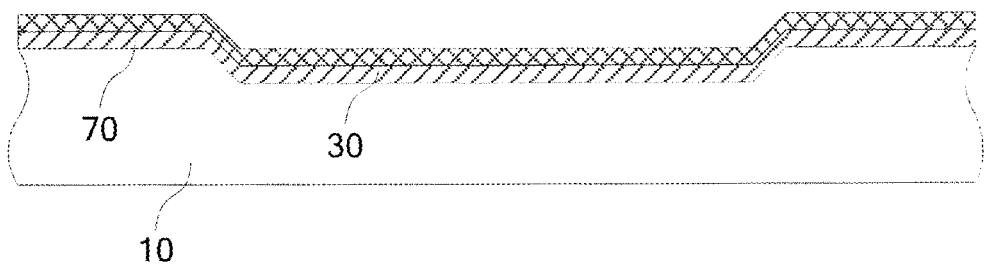
FIGS. 4A to 4G are the schematic diagrams of the manufacturing flow of FIG. 1B of the present application.

In the embodiment of FIG. 1B, the underlying color layer 70 and the lift-off photoresist layer 30 formed on the 3-dimensional substrate 10 in sequence can be described in accordance with steps 111,112 illustrated by FIG. 4A.

Figure 4B:
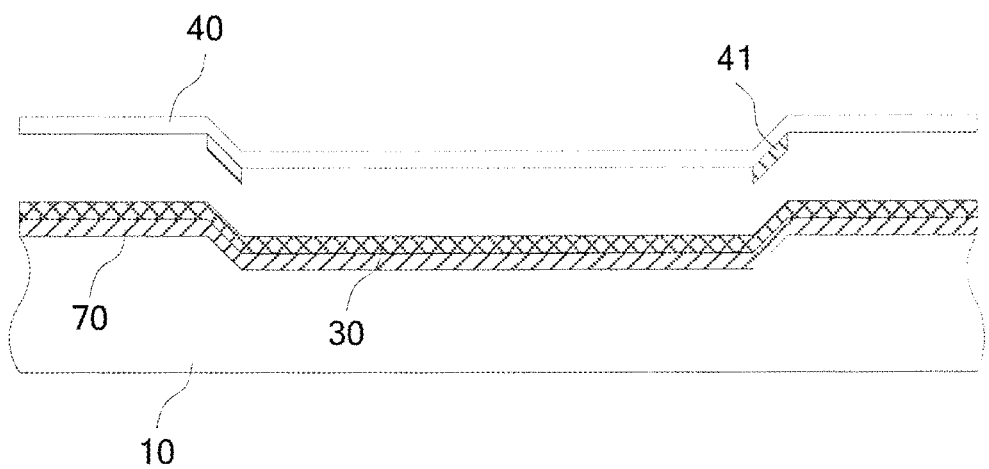

FIG. 4B illustrates step 113 that attaching a dimensional photomask 40 on the 3-dimensional substrate 10, wherein the dimensional photomask 40 arranges the pattern structure thereon. Therefore, the so called dimensional photomask 40 can be achieved by using film type photomask and attaching aids.

Figure 4C:
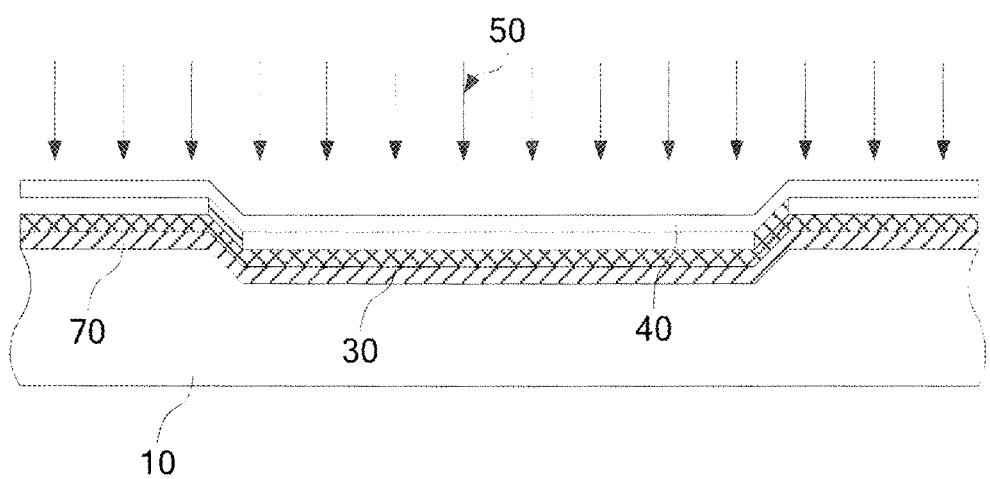

FIG. 4C illustrates step 114 that the exposure is processed by using ultraviolet 50.

Figure 4D:
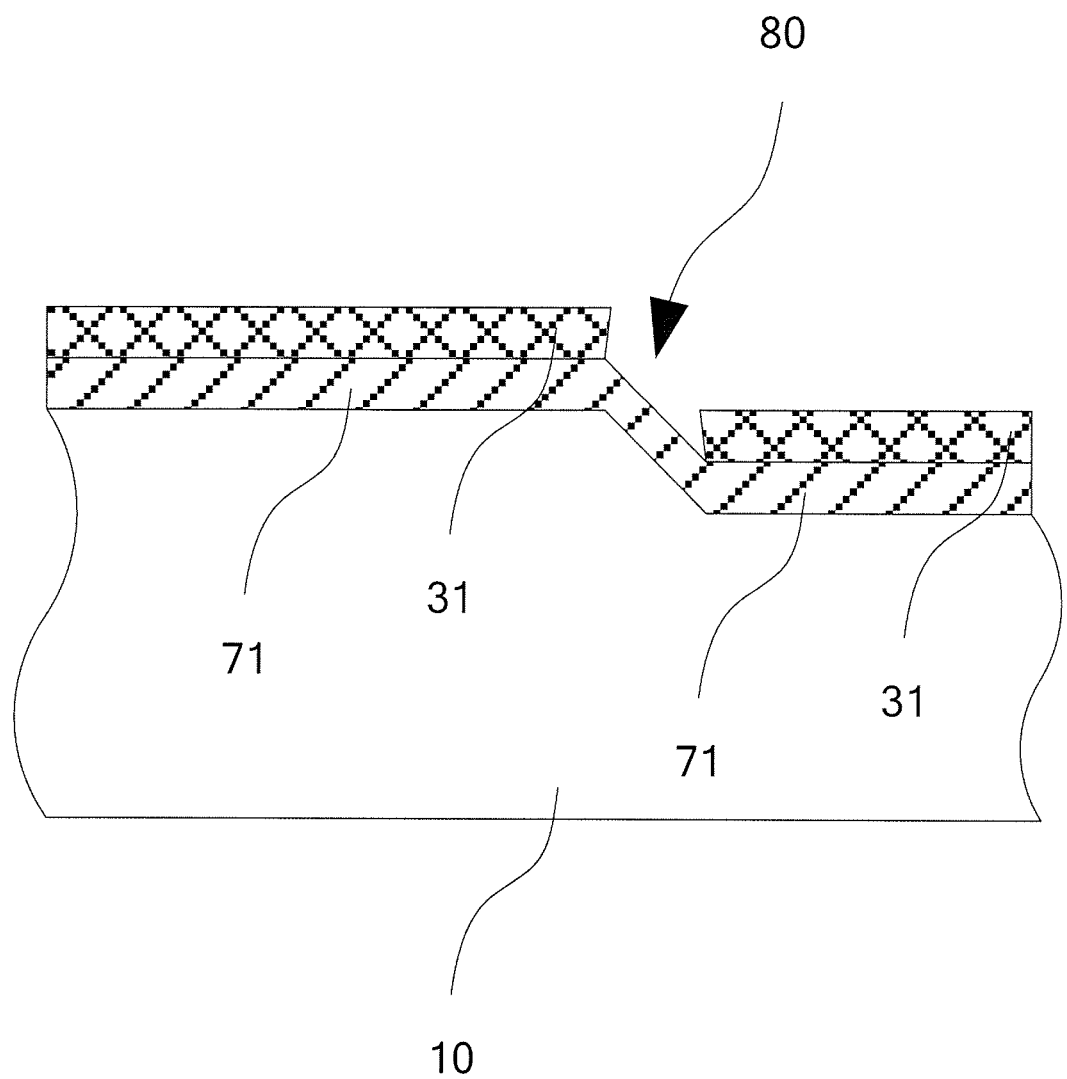

FIG. 4D is the magnified diagram of part 3 of FIG. 4C to clarify step 115: the resulted structure of the lift-off photoresist layer 31 after removing the unexposed part of the lift-off photoresist layer 30 to form a pattern space 80. It can be figured out that the lift-off photoresist layer 31 is in a shape of inverted trapezoidal distinguished from the underlying color layer 71. In accordance with the special structure of the lift-off photoresist layer 31, the film layer subsequently formed thereon can be easily removed.

Figure 4E:
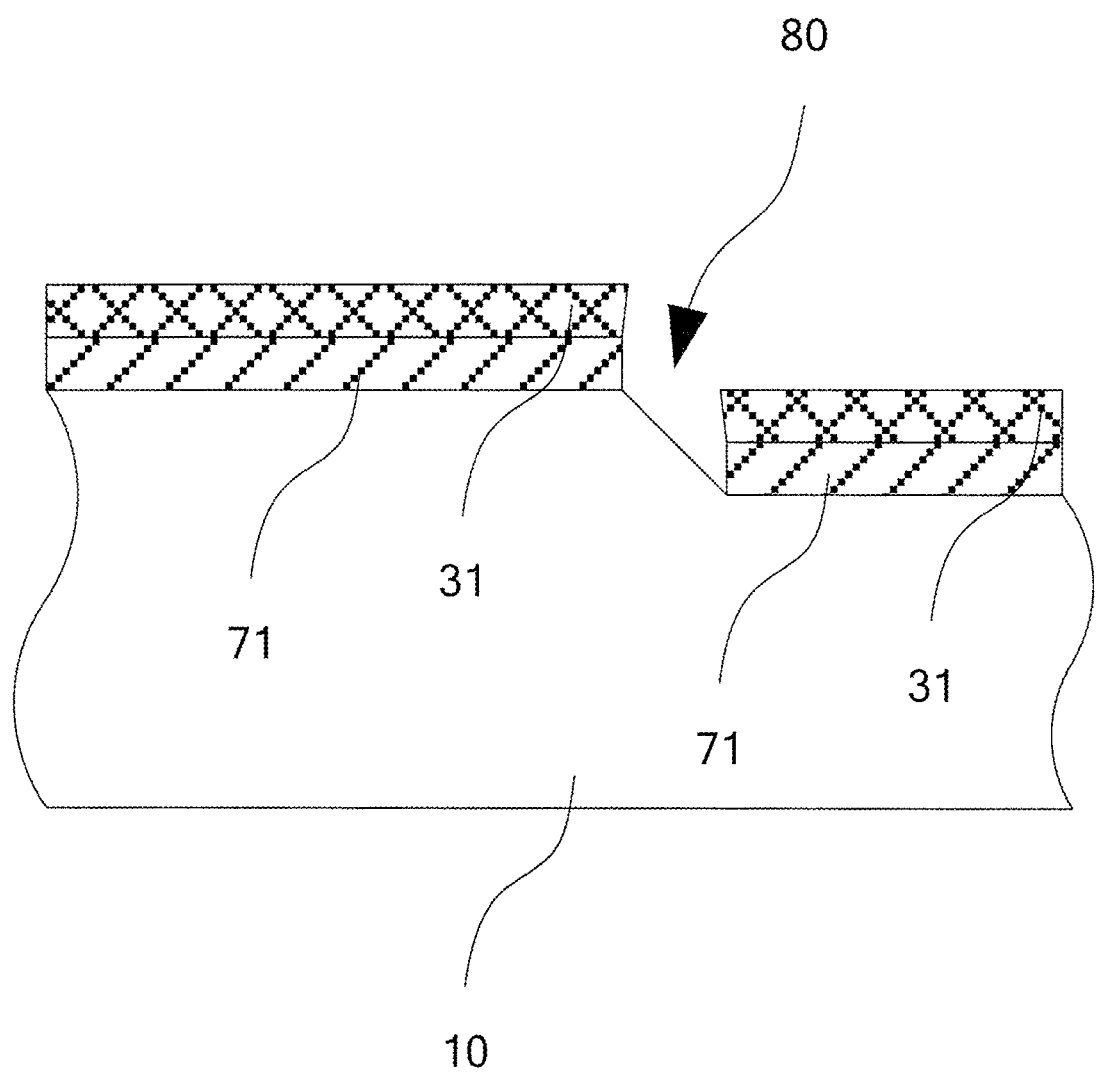

FIG. 4E is the magnified diagram of part 3 of FIG. 4C to clarify step 116: the resulted structure of the underlying color layer 71 after removing the lift-off photoresist layer 30 to form the underlying color layer 71 under the pattern space 80. It can be figured out that the lift-off photoresist layer 31 is in a shape of inverted trapezoidal distinguished from the underlying color layer 71.

Figure 4F:
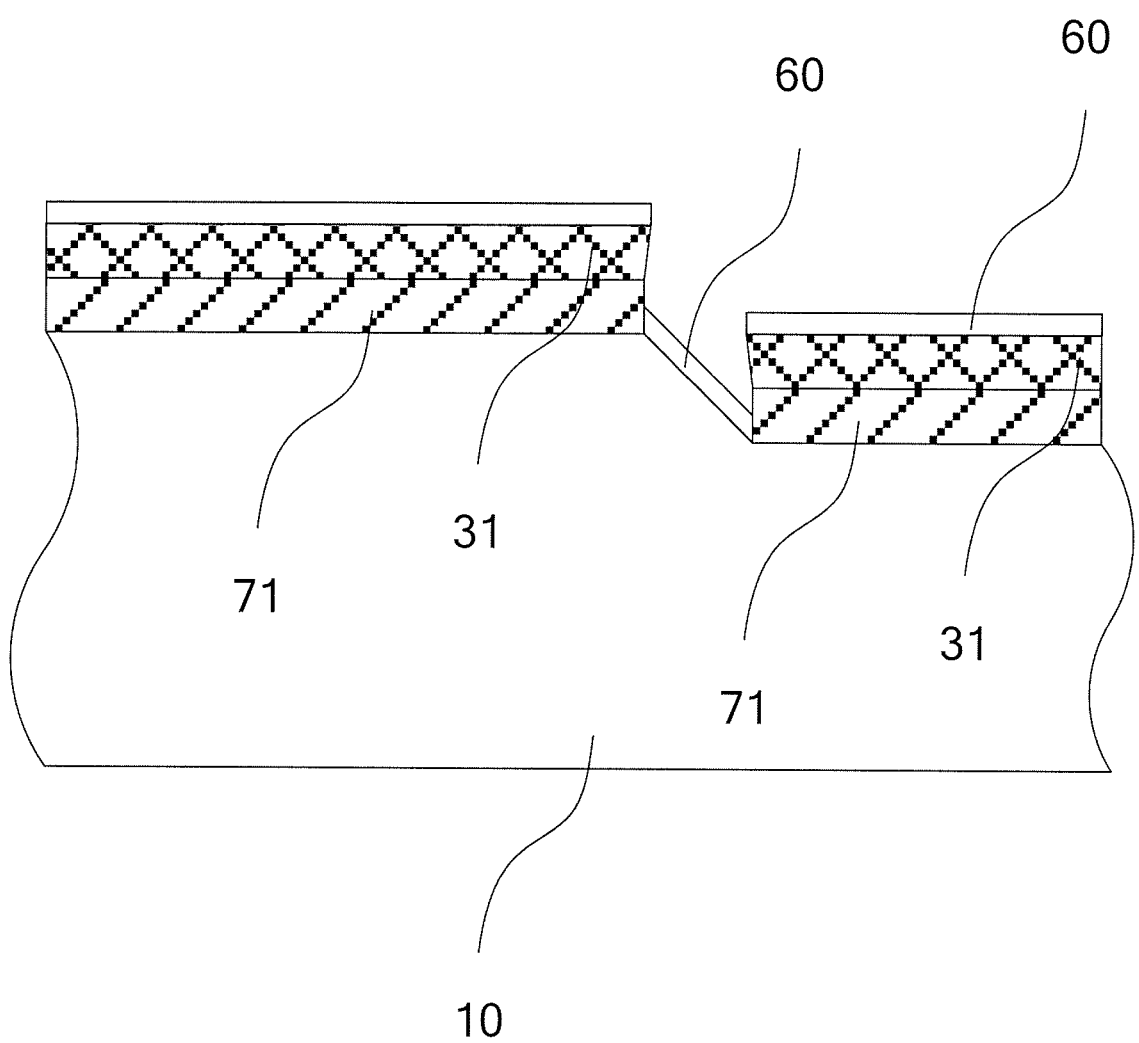

FIG. 4F illustrates step 117: the situation of forming the film layer 60 on the 3-dimensional substrate having the pattern space 80. It can be figured out that the original pattern space 80 is covered with film layer 60, and the film layer 60 is also formed on a part not removed by the developer of the lift-off photoresist layer 31. The film layer 60 formed on the lift-off photoresist layer 31 can be removed in together with that formed on the pattern space 80.

Figure 4G:
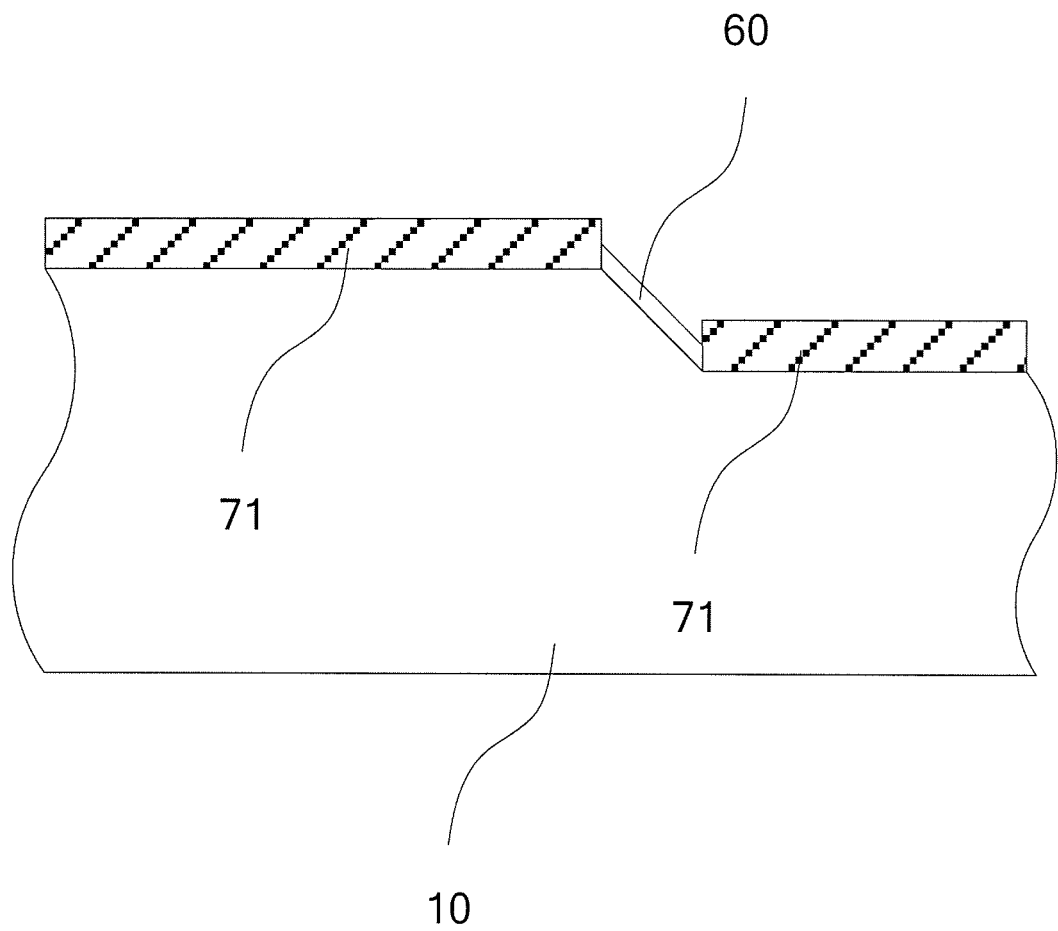

FIG. 4G illustrates step 118: a condition of after lifting off the lift-off photoresist layer 31 to form a film type pattern. In FIG. 4G it can be clearly identified that only the film layer 60 is left on the dimensional portion of the 3-dimensional substrate 10, and other portion is covered with the underlying color layer 71. Accordingly, the pattern structure of FIG. 2B can be formed.

Regarding the manufacturing of FIGS. 1A and 1C, the concept of the substrate can be basically a plate substrate or a 3-dimensional substrate. In the embodiments of FIGS. 3A to 3F and FIGS. 4A to 4G, the 3-dimensional substrate 10 is taken to be a described embodiment, however the manufacturing process of the plate substrate is the same that of the 3-dimensional substrate basically, and the difference between them is simply the type of substrate, therefore it's unnecessary to additionally make more description.

Principally, no matter applying the manufacturing method of the substrate having film type pattern to a plate substrate or a 3-dimensional substrate, the process are similar, and the specific technical effect such as using once photomask, etching-free or once etching can be equally achieved. The seamless film type pattern on a substrate especially on a 3-dimensional substrate can be achieved, and the conventional art is far away to achieve the same effect.

For the substrate having film type pattern of the present application, the film type pattern can be produced on a plate and a 3-dimensional substrate. Two embodiments are listed below for the description.

Figure 5:
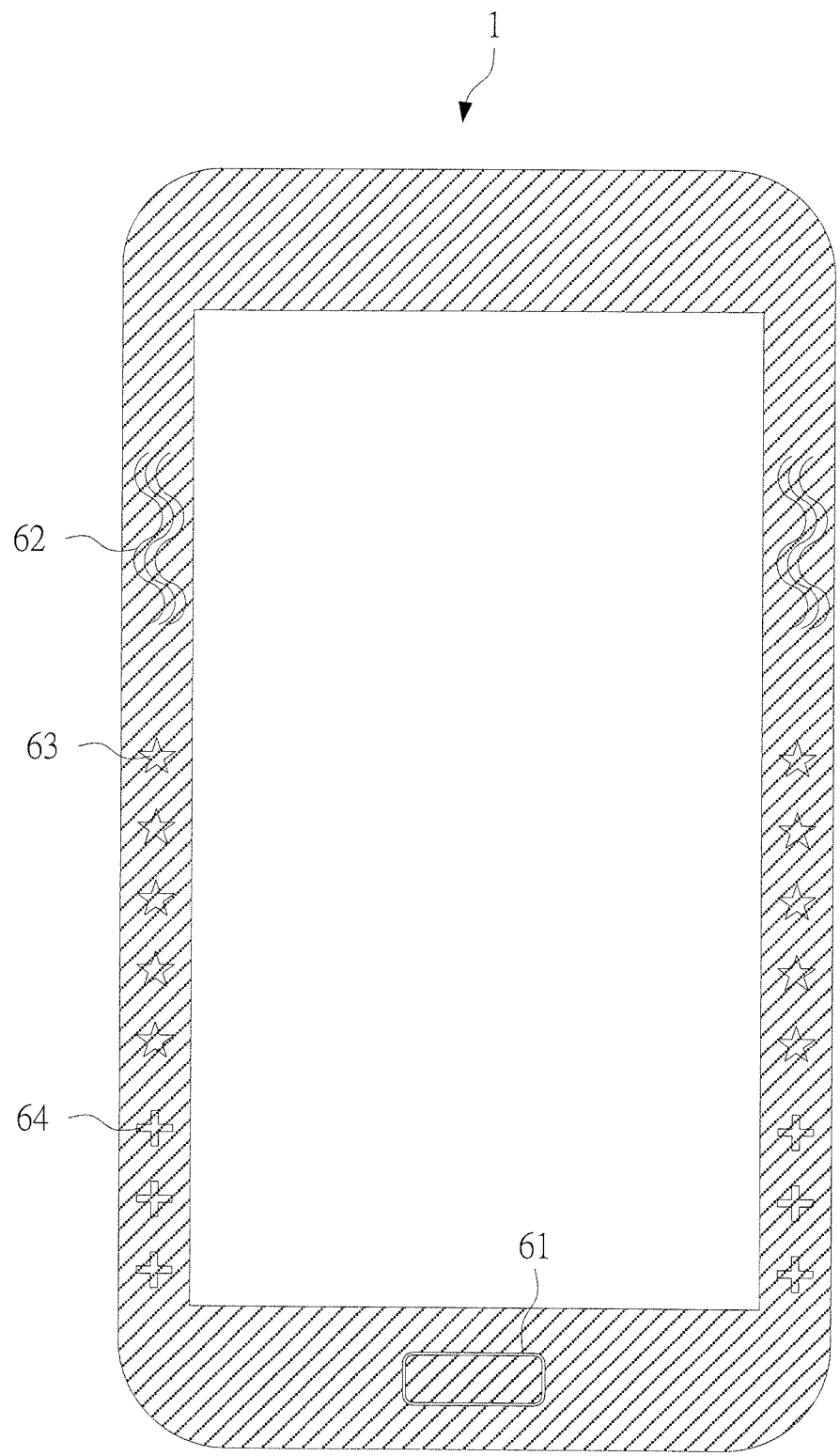
FIG. 5 is another embodiment of the substrate having film type pattern of the present application.

Please refer to FIG. 5, another specific embodiment of the substrate 1 having the film type pattern is disclosed. By using the manufacturing process of FIG. 1B and FIG. 1D, the film type pattern 62, 63, 64 located on a plate portion and film type pattern 61 located on the dimensional portion can be produced simultaneously.

Figure 6:
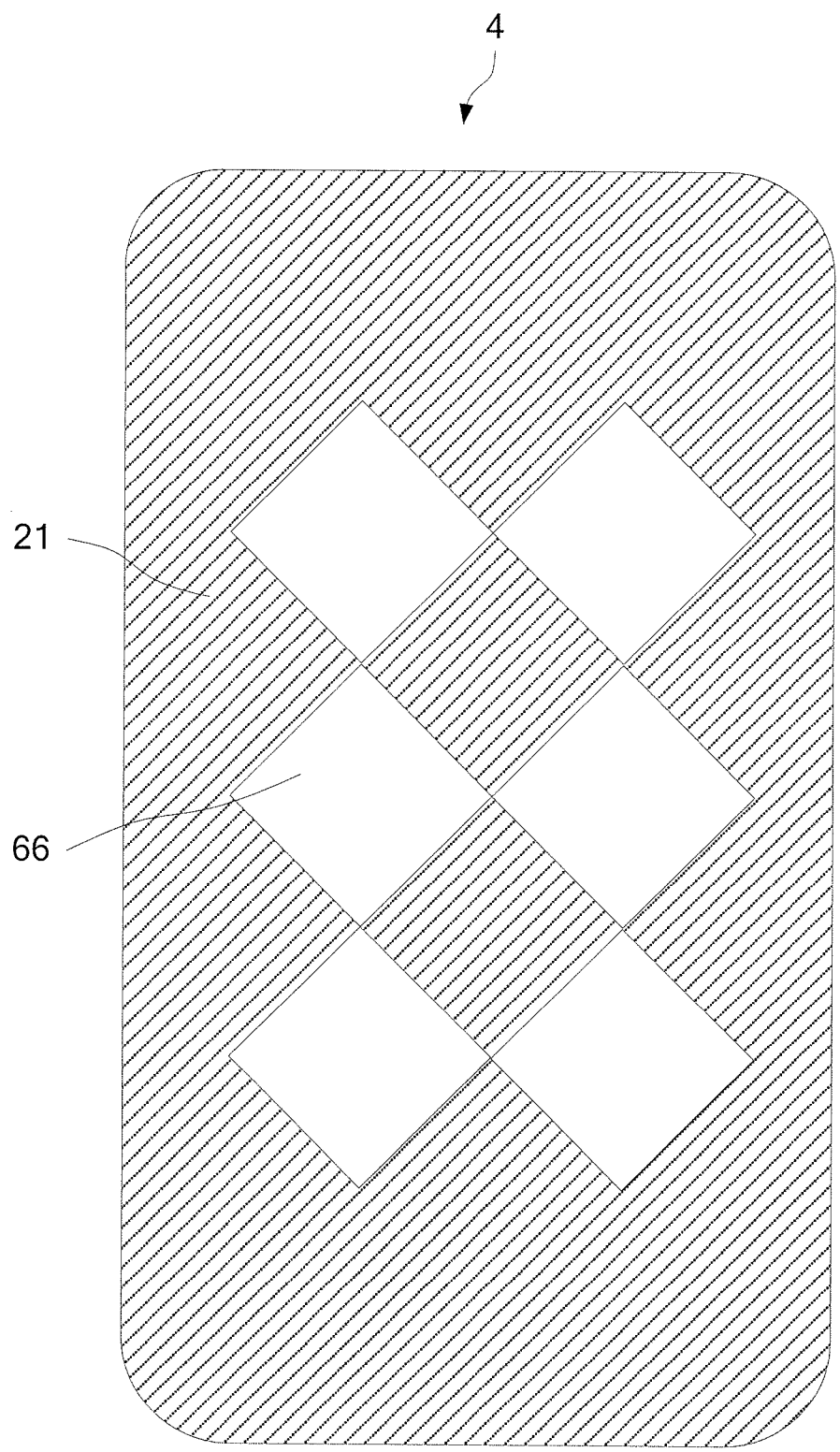
FIG. 6 is another embodiment of the substrate having film type pattern of the present application.

Please referring to FIG. 6, another specific embodiment of the substrate 4 having film type pattern of the present application is disclosed. By using the manufacturing process of FIGS. 1A and 1C, the film type pattern 66 located on the plate portion can be formed. Apparently, entire of the surface of the substrate 4 simply includes the underlying photoresist layer 21 and film type pattern 66, and the film type 66 can be formed by a single-layer film or a multi-layers film. In accordance with the photoresist lifting-off process is applied to the present application, the film-deposition region can be formed under once photomask, and the multi-layers film can be formed by alternately depositing multiple films on the film-deposition region. After removing the unnecessary photoresist, a close structure including the film type pattern layer and the none-film-type pattern layer (periphery pattern layer) can be formed.

Especially, in accordance with the photomask process is applied to the present application, and the film type pattern can include single-layer film or multi-layers film, the film type pattern can be formed to be very fine, and every special pattern effect can be simulated, such as the effect of laser pattern.

Although the present application has been explained above, it is not the limitation of the range, the sequence in practice, the material in practice, or the method in practice. Any modification or decoration for present application is not detached from the spirit and the range of such.

What is claimed is:

1. A substrate having a film pattern, comprising:
   a 3-dimensional substrate including a first section having a first height, a second section having a second height that is different from the first height, and a dimensional part connecting the first section and the second section;
   a photoresist pattern layer including a first pattern section formed on the first section of the 3-dimensional substrate and a second pattern section formed on the second section of the 3-dimensional substrate; and
   at least a film pattern layer formed only on the dimensional part of the 3-dimensional substrate, the film pattern layer contacting the first pattern section and the second pattern section of the photoresist pattern layer, wherein
   a top surface of the first pattern section and a top surface of the second pattern section of the photoresist pattern layer are free from the film pattern layer, and
   the film pattern layer is a structure independent from the first pattern section and the second pattern section and attached to a side surface of the first pattern section and a side surface of the second pattern section.

2. The substrate of claim 1, wherein the film pattern layer is selected from the group consisting of: a metal film layer, an inorganic metal oxide film layer, a non-metal oxide film layer and a non-metal film layer.

3. The substrate of claim 1, wherein the photoresist pattern layer is an underlying photoresist layer or selected from the group consisting of: a metal film layer, an inorganic metal oxide film layer, a non-metal oxide film layer and a non-metal film layer.

4. A manufacturing method for making the substrate according to claim 1, comprising:
   forming an underlying color layer on a substrate;
   forming a lift-off photoresist layer on the substrate having the underlying color layer;
   providing a photomask attached on the substrate;
   processing an exposure;
   removing an unexposed part of the lift-off photoresist layer to form a pattern space;
   removing the underlying color layer under the pattern space formed by the lift-off photoresist;
   forming at least a film layer on a partial region having the pattern space of the substrate; and
   forming a film type pattern by removing the lift off photoresist layer, wherein the film type layer is adjacent the underlying color layer to form a seamlessly close structure.

5. The method of claim 4, wherein the at least a film layer is selected from the group consisting of: a metal film layer, an inorganic metal oxide film layer, a non-metal oxide film layer and a non-metal film layer.

6. The method of claim 4, wherein the substrate comprises a plate substrate or a 3-dimensional substrate.

7. The method of claim 4, wherein the underlying color layer comprises a metal film layer, an inorganic metal oxide film layer, a non-metal oxide film layer or a non-metal film layer.

8. The method of claim 4, wherein the method for forming the film layer includes sputtering, deposition or spraying.

9. A manufacturing method for making the substrate according to claim 1, comprising steps of:
   forming an underlying photoresist layer on a substrate;
   forming a lift-off photoresist layer on the substrate having the underlying photoresist layer;
   providing a photomask attached on the substrate;
   processing an exposure;
   once removing an unexposed part of the lift-off photoresist layer and the underlying photoresist layer to form a pattern space;
   forming at least a film layer on partial region having the pattern space of the substrate; and
   forming a film type pattern by removing the lift off photoresist layer, wherein the film type layer is adjacent the underlying color layer to form a seamlessly close structure.

10. The method of claim 9, wherein the at least a film layer is selected from the group consisting of: a metal film layer, an inorganic metal oxide film layer, a non-metal oxide film layer and a non-metal film layer.

11. The method of claim 9, wherein the substrate comprises a plate substrate or a 3-dimensional substrate.

12. The method of claim 9, wherein the substrate is a 3-dimensional substrate, and the film type pattern is formed on the dimensional part of the 3-dimensional substrate.

\* \* \* \* \*